(12) United States Patent
Yang et al.

(10) Patent No.: US 7,955,092 B2
(45) Date of Patent: Jun. 7, 2011

(54) CONNECTION BASE ASSEMBLY FOR AN IC TESTING APPARATUS

(76) Inventors: Yi-Chih Yang, Kaohsiung County (TW); Ming-Jui Lin, Kaohsiung County (TW)

( * ) Notice: Subject to any disclaimer, the term of this patent is extended or adjusted under 35 U.S.C. 154(b) by 45 days.

(21) Appl. No.: 12/643,231

(22) Filed: Dec. 21, 2009

(65) Prior Publication Data
US 2010/0178782 A1 Jul. 15, 2010

(30) Foreign Application Priority Data
Jan. 13, 2009 (TW) .............................. 98100988 A (51) Int. Cl.
*H01R 12/00* (2006.01)
(52) U.S. Cl. ......................................................... 439/72
(58) Field of Classification Search ............... 439/66, 439/70, 71, 72, 73
See application file for complete search history.

(56) References Cited

U.S. PATENT DOCUMENTS

| | | | | |
|---|---|---|---|---|
| 4,445,735 A * | 5/1984 | Bonnefoy | ........................ | 439/66 |
| 5,594,355 A * | 1/1997 | Ludwig | .................... | 324/750.25 |
| 5,899,755 A * | 5/1999 | Kline | ............................... | 439/66 |
| 5,947,749 A * | 9/1999 | Rathburn | ........................ | 439/66 |
| 6,203,329 B1 * | 3/2001 | Johnson et al. | ................. | 439/66 |
| 6,231,353 B1 * | 5/2001 | Rathburn | ........................ | 439/66 |
| 6,570,393 B2 * | 5/2003 | Johnson | ......................... | 324/538 |
| 6,854,981 B2 * | 2/2005 | Nelson | ............................. | 439/66 |
| 7,059,866 B2 * | 6/2006 | Gilk | ................................. | 439/66 |
| 7,121,842 B2 * | 10/2006 | Kimura | ............................ | 439/73 |
| 7,326,064 B2 * | 2/2008 | Rathburn et al. | ............... | 439/66 |
| 7,338,293 B2 * | 3/2008 | Gilk | ................................. | 439/66 |
| 7,619,425 B2 * | 11/2009 | Kimura | .................... | 324/756.05 |
| 7,639,062 B2 * | 12/2009 | Sumita | .......................... | 327/374 |
| 7,722,361 B2 * | 5/2010 | Lopez et al. | .................... | 439/72 |
| 7,737,708 B2 * | 6/2010 | Sherry | .................... | 324/762.03 |
| 7,819,672 B2 * | 10/2010 | Osato | ............................... | 439/66 |
| 2004/0217771 A1 * | 11/2004 | Leong | ............................ | 324/754 |
| 2007/0007948 A1 * | 1/2007 | Kimura et al. | ............. | 324/158.1 |
| 2009/0021274 A1 * | 1/2009 | Kimura | .......................... | 324/755 |

FOREIGN PATENT DOCUMENTS
| TW | 200710396 A | 3/2007 |
|---|---|---|
| TW | 200741210 A | 11/2007 |
| TW | I291271 B | 12/2007 |

* cited by examiner

*Primary Examiner* — Neil Abrams
(74) *Attorney, Agent, or Firm* — Apex Juris, pllc; Tracy M. Heims (57) ABSTRACT

A connection base assembly for an IC testing apparatus has a base, a top cap and a conductive assembly. The base has a bottom board and an outer frame provided with multiple grooves. The grooves are defined in the top of and extend to the bottom of the outer frame to form multiple through holes in the bottom of the outer frame. The conductive assembly is mounted between the base and the top cap and has multiple conductive elements, multiple top resilient elements and multiple bottom resilient elements. The conductive elements are mounted respectively in the grooves in the outer frame of the base, and each conductive element has a contacting segment and a connecting segment. The top resilient elements and the bottom resilient elements are respectively mounted on and abut with the tops and the bottoms of the conductive elements.

7 Claims, 8 Drawing Sheets

CONNECTION BASE ASSEMBLY FOR AN IC TESTING APPARATUS

BACKGROUND OF THE INVENTION

1. Field of the Invention

The present invention relates to a connection base assembly, and more particularly to a connecting base assembly for an IC (integrated circuit) testing apparatus.

2. Description of Related Art

After an IC being manufactured and encapsulated, a test may be processed to ensure the IC to achieve designed and desired functions and capabilities.

A testing apparatus for an IC comprises a connection base, a pressing device, a circuit board provided with a testing circuit and a computer. The connecting base has a holding space and multiple conductive elements mounted in and around the holding space. An IC is mounted in the holding space and legs of the IC align and contact respectively with the conductive elements. The pressing device can push connection base with the IC to make the conductive elements contacting with conductive points on the circuit board, such that the IC is connected electrically to the testing circuit on the circuit board via the conductive elements. Consequently, the IC can be tested with the testing circuit and programs set in the computer.

There are different types of testing apparatuses are known as follows.

Taiwan patent application Publication No. 200741210, entitled to "ELECTRONIC DEVICE TEST SET AND CONTACT USED THEREIN", shows a conductive element having a first end and a second end. The first end of the conductive element has multiple contacting points and contacts with a leg of an IC. The second end has a curved edge and contacts with a conductive point on a circuit board. Two resilient elements are respectively mounted on and abut with two sides of the conductive element.

Taiwan Patent No. I291271, entitled to "IMPROVED INTEGRATED CIRCUIT CONTACT TO TEST APPARATUS", shows a conductive element having a first end and a second end. The first end of the conductive element contacts with a leg of an IC, and the second end contacts with a conductive point on a circuit board. Two resilient elements are respectively mounted on and abut with two sides of the conductive element, and two contacting interfaces are defined respectively between the resilient elements and the sides of the conductive element.

Taiwan patent application Publication No. 200710396, entitled to "TEST SOCKET", shows a conductive element having a first end and a second end. The first end of the conductive element contacts with a leg of an IC, and the second end contacts with a conductive point on a circuit board. Two resilient elements are respectively mounted on and abut with two sides of the conductive element.

The resilient elements of these conventional apparatuses can provide a recoil force to the conductive elements to push the conductive elements to the original positions. However, the forces provided by the resilient elements are along a longitudinal direction but cannot be provided to against a lateral side force. Therefore, when the IC is pushed to make the legs of the IC contacting with the conductive elements, the conductive elements may be moved or pivoted unstably to cause the conductive elements disengaging from legs on the IC or conductive points.

To overcome the shortcomings, the present invention tends to provide a connection base assembly to mitigate or obviate the aforementioned problems.

SUMMARY OF THE INVENTION

The main objective of the invention is to provide a connection base assembly for an IC testing apparatus to provide a stable electrical connection between an IC and a circuit board.

The connection base assembly has a base, a top cap and a conductive assembly. The base has a top and a bottom and comprises a bottom board and an outer frame. The bottom board has a top. The outer frame is formed around and connected to the bottom board and has a top, a bottom and multiple grooves. The grooves are defined in the top of and extend to the bottom of the outer frame to form multiple through holes in the bottom of the outer frame. The top cap is mounted securely on the top of the base and has a bottom and a positioning hole defined through the top cap and corresponding to the bottom board of the base. The conductive assembly is mounted between the base and the top cap and comprises multiple conductive elements, multiple top resilient elements and multiple bottom resilient elements. The conductive elements are mounted respectively in the grooves in the outer frame of the base, and each conductive element has a contacting segment and a connecting segment. The contacting segment has a top edge, a bottom edge, an abutting end, a pressing end protruding from the top of the bottom board of the base and a protrusion. The protrusion is formed on and protrudes from the top edge at the pressing end of the contacting segment. The connecting segment is formed on and protrudes from the bottom edge of the contacting segment and extends into the through hole of a corresponding groove. The top resilient elements are mounted on the top of the base and abut against the abutting ends of the contacting segments of the conductive elements. The bottom resilient elements are mounted on the bottom of the base and abut with the connecting segments of the conductive elements.

Other objects, advantages and novel features of the invention will become more apparent from the following detailed description when taken in conjunction with the accompanying drawings.

DETAILED DESCRIPTION OF PREFERRED EMBODIMENT

With reference to FIGS. 1 to 4, a connection base assembly (1) for an IC testing apparatus in accordance with the present invention comprises a base (10), a top cap (20) and a conductive assembly mounted between the base (10) and the top cap (20).

The base (10) has a top and a bottom and comprises a bottom board (11) and an outer frame (12). The bottom board (11) may be square in shape and has a top and a holding space (13) defined in the top. The outer frame (12) is formed around and connected to the bottom board (11) and has a top, a bottom and multiple grooves (14). The grooves (14) are defined in the top of and extend to the bottom of the outer frame (12) to form multiple through holes (141) in the bottom of the outer frame (12). In the preferred embodiment, the grooves (14) are arranged in four groups respectively on four sides of the outer frame (12). The outer frame (12) may further have multiple connecting arms (16) formed on and protruding from corners of the outer frame (12).

The top cap (20) is mounted securely on the top of the base (10), may be connected securely to the connecting arms (16) on the outer frame (12) and has a bottom and a positioning hole (21). The positioning hole (21) is defined through the top cap (20) and corresponds to holding space (13) in the top of the bottom board (11).

The conductive assembly is mounted between the base (10) and the top cap (20) and comprises multiple conductive elements (50) and multiple resilient elements (30,40).

The conductive elements (50) are mounted respectively in the grooves (14) in the outer frame (12) of the base (10), and each conductive element (50) may be T-shaped and comprises a contacting segment (51) and a connecting segment (52). The contacting segment (51) may be elongated and has a top edge, a bottom edge, an abutting end (513) and a pressing end (511) opposite to the abutting end (513) and protruding from the top of the bottom board (11) of the base (10).

The connecting segment (52) is formed on and protrudes from the bottom edge of the contacting segment (51) and extends into the through hole (141) of a corresponding groove (14).

The resilient elements (30,40) include multiple top resilient elements (30) and multiple bottom resilient elements (40). The top resilient elements (30) are mounted on the top of the base (10) and abut against the abutting ends (513) of the contacting segments (51) of the conductive elements (50). The bottom resilient elements (40) are mounted on the bottom of the base (10) and abut with the connecting segments (52) of the conductive elements (50). Accordingly, the top and bottom resilient elements (30,40) are respectively mounted on and abut with the tops and bottoms of the conductive elements (50). In the preferred embodiment, the resilient elements (30,40) are resilient rods.

Figure 1:
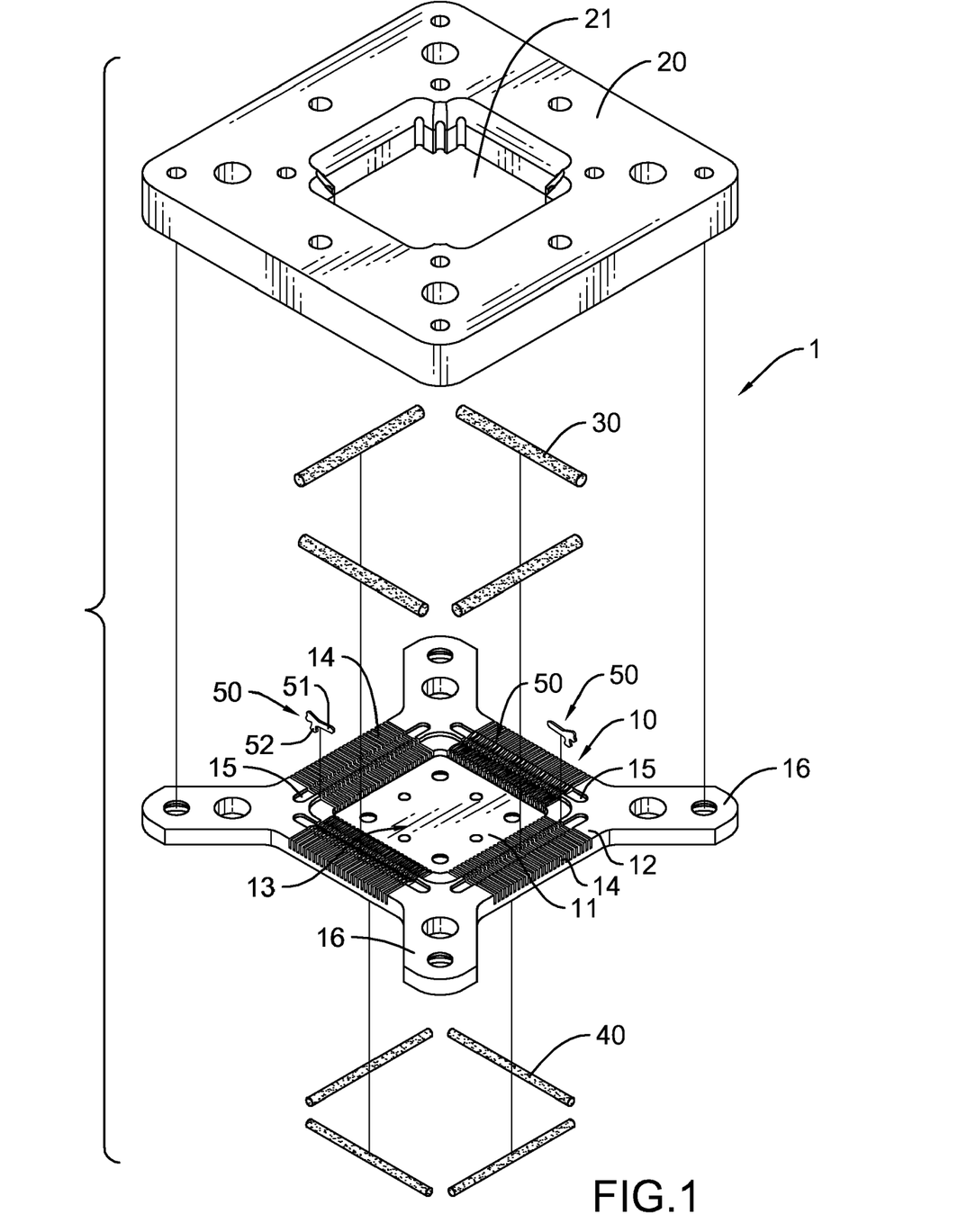
FIG. 1 is an exploded perspective view of a connection base assembly in accordance with the present invention.
Figure 2:
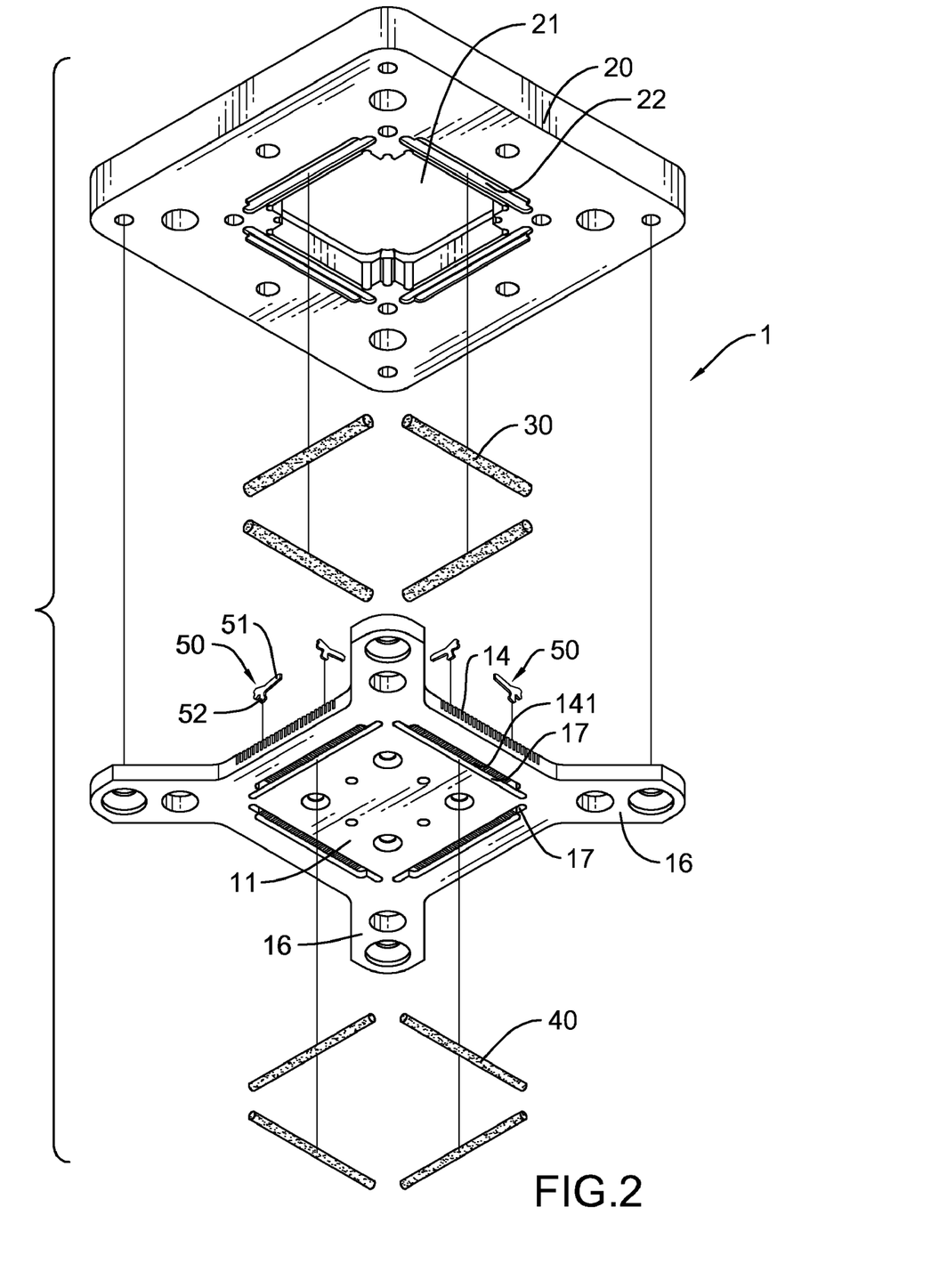
FIG. 2 is another exploded perspective view of the connection base assembly in FIG. 1.
Figure 3:
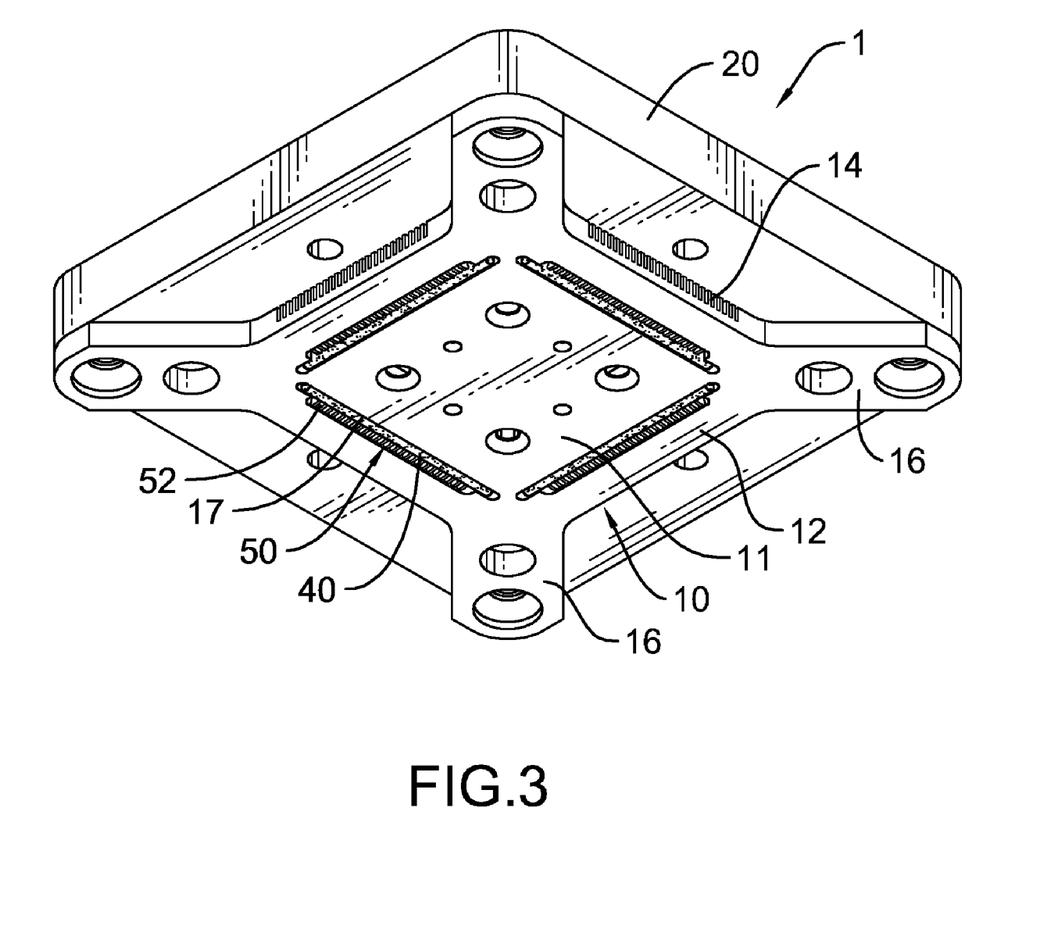
FIG. 3 is a bottom perspective view of the connection base assembly in FIG. 1.
Figure 4:
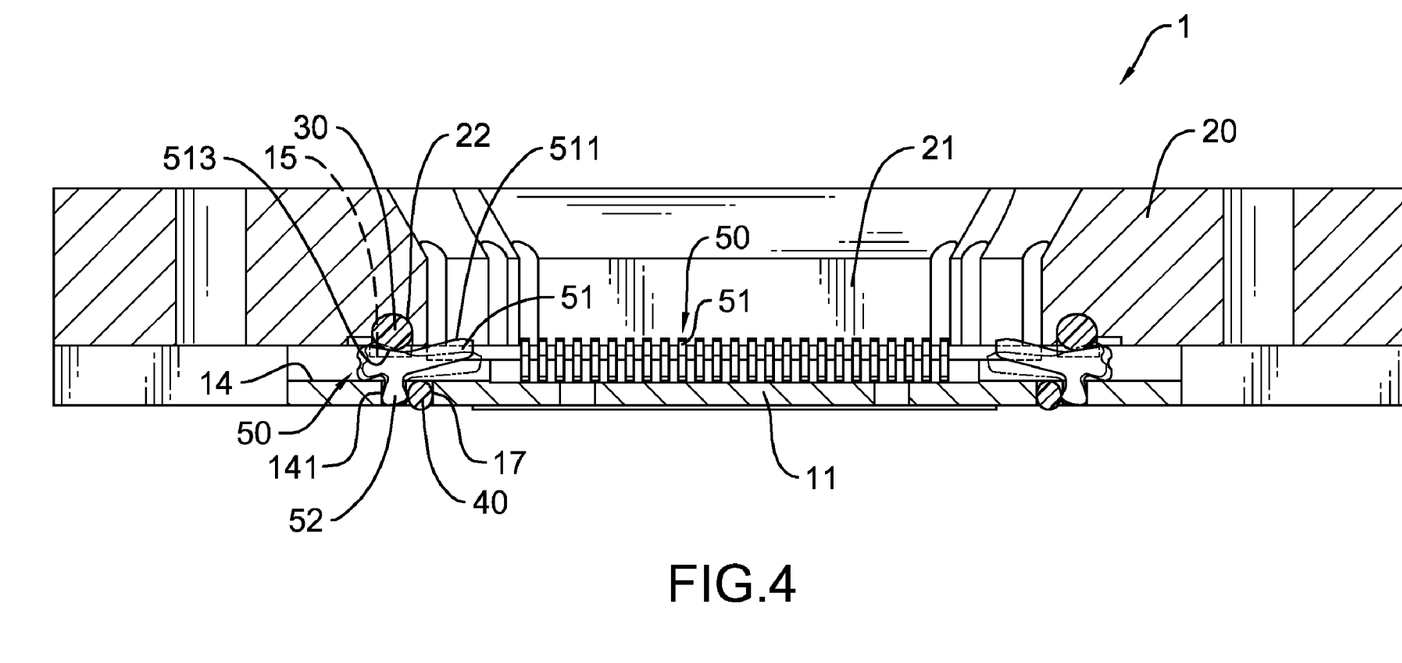
FIG. 4 is an operational side view in partial section of the connection base assembly in FIG. 1.
Figure 5:
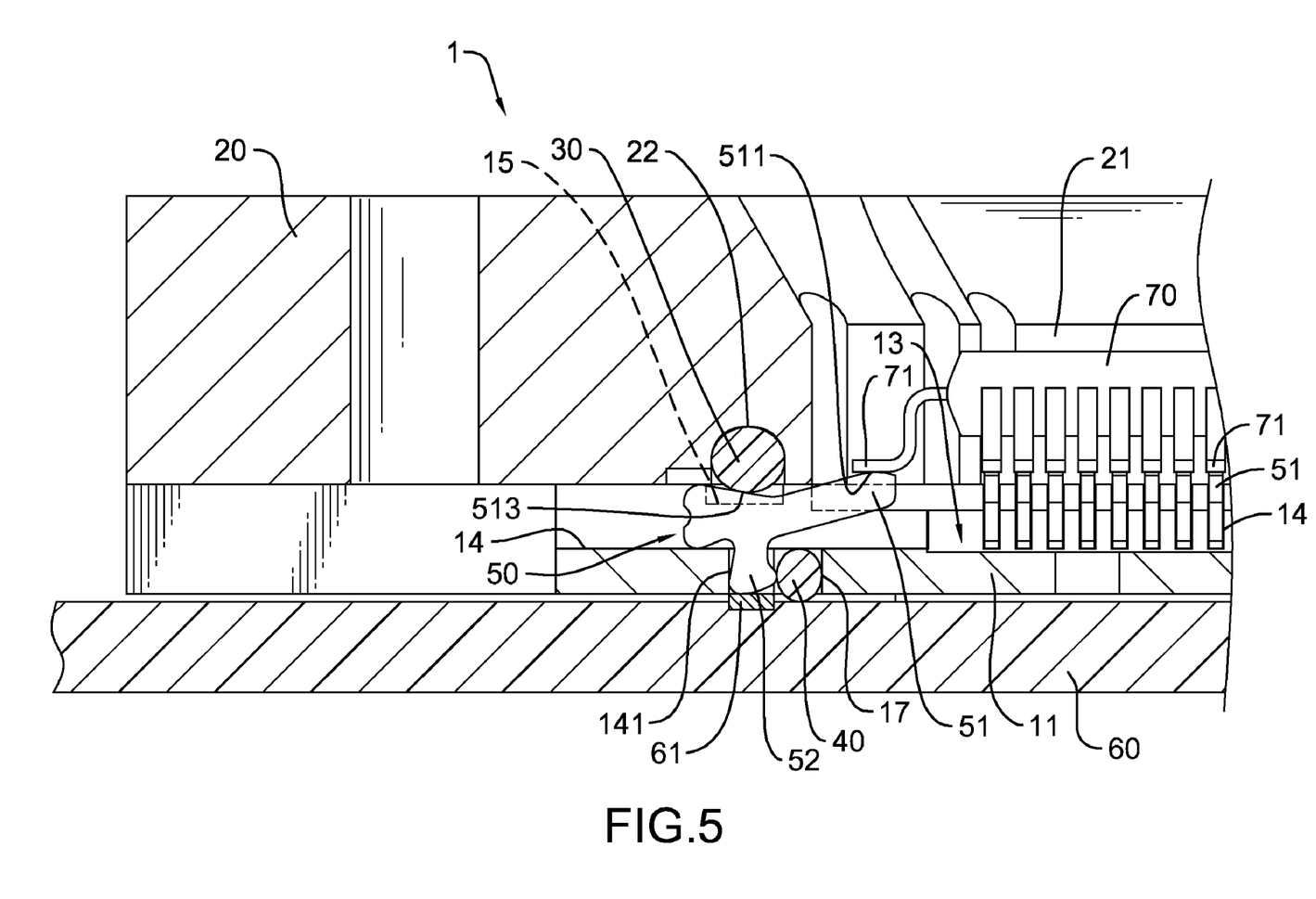
FIG. 5 is an enlarged side view in partial section of the connection base assembly in FIG. 4.

To hold the resilient elements (30,40) on the base (10), with further reference to FIG. 5, the outer frame (12) of the base (10) further has multiple top positioning recesses (15) and multiple bottom positioning recesses (17). The top positioning recesses (15) are defined in the top of the outer frame (12) and are respectively mounted across and communicate with the groups of the grooves (14). The bottom positioning recesses (17) are defined in the bottom of the outer frame (12), and each bottom positioning recess (17) is mounted across and communicates with the through holes (141) of a corresponding group of the grooves (14). In the first embodiment, the bottom positioning recess (17) is defined at a side of the through hole (141) facing the holding space (13) on the bottom board (11). The top cap (20) further has multiple holding recesses (22) defined in the bottom of the top cap (20) and aligning respectively with the top positioning recesses (15) in the outer frame (12). The top resilient elements (30) are held respectively in the aligning holding recesses (22) in the top cap (20) and the top positioning recesses (15) in the outer frame (12). The bottom resilient elements (40) are held respectively in the bottom positioning recesses (17) in the outer frame (12).

Figure 6:
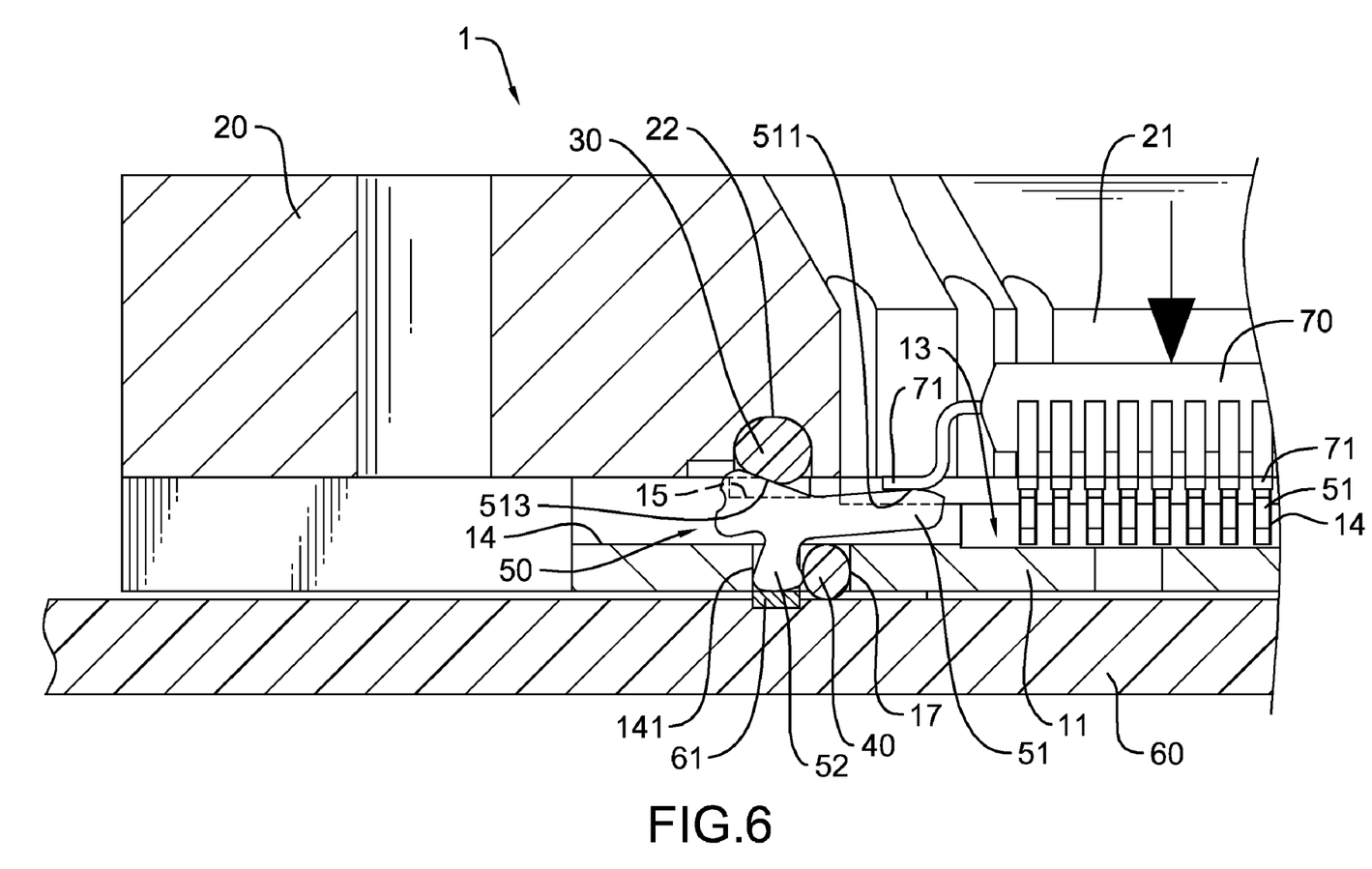
FIG. 6 is an enlarged operational side view in partial section of the connection base assembly in FIG. 4 showing the IC being pushed.

With reference to FIGS. 5 and 6, the connection base assembly (1) is mounted on a circuit board (60) having a testing circuit provided with multiple conductive points (61), and the connecting segments (52) of the conductive elements (50) respectively correspond to and align with the conductive points (61). An IC (70) is mounted into the holding space (13) on the bottom board (11) via the positioning hole (21) in the top cap (20), and the legs (71) of the IC (70) contact respectively with the pressing ends (511) of the contacting segments (51) of the conductive elements (50). The IC (70) is then pressed downward by a pressing device, and the conductive elements (50) can be pivoted at the connecting segments (52) as pivoting points. Consequently, the abutting ends (513) of the contacting segments (51) will move upward and compress and deform the top resilient elements (30), and the connecting segments (52) will compress and deform the bottom resilient elements (40). With the deformation of the resilient elements (30,40), a shock-absorbing effect and a supporting effect are provided to make the conductive elements (50) pivotally rotating in stable. Consequently, the contacts between the conductive elements (50) and the legs (71) of the IC (70) or the conductive points (61) on the circuit board (60) are ensured. Thus, a stable electrical connection between the legs (71) of the IC (70), conductive elements (50) and conductive points (61) on the circuit board (60) is achieved, and the test to the IC (70) can be actually processed.

After the IC (70) being tested and removed from the holding space (13), the conductive elements (50) can be pivoted to the original positions with the recoil forces provided by the resilient elements (30,40).

Figure 7:
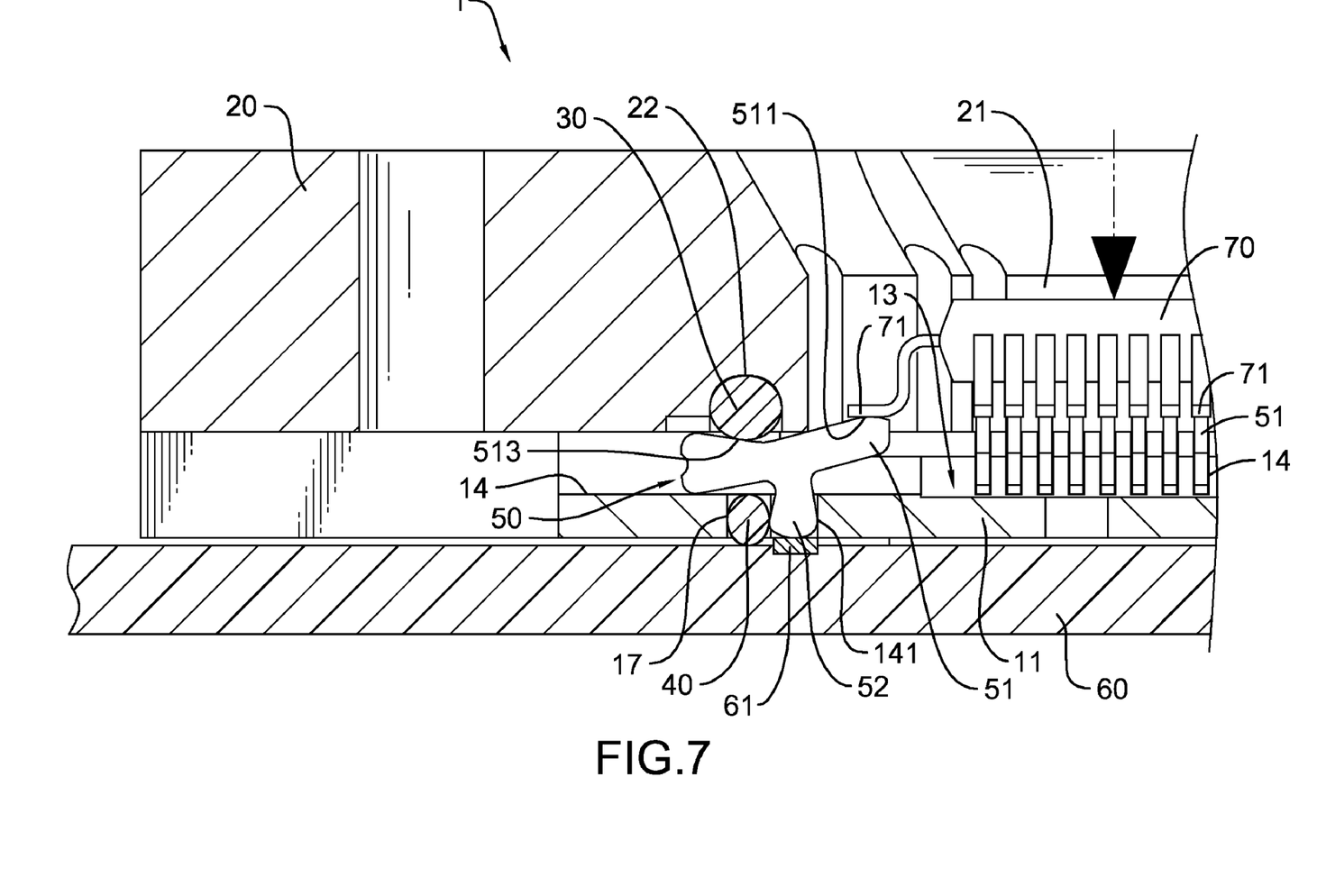
FIG. 7 is an enlarged side view in partial section of a second embodiment of a connection base assembly in accordance with the present invention.

In the second embodiment shown in FIG. 7, each bottom positioning recess (17) is defined at a side of the through hole (141) opposite to the holding space (13) on the bottom board (11).

Figure 8:
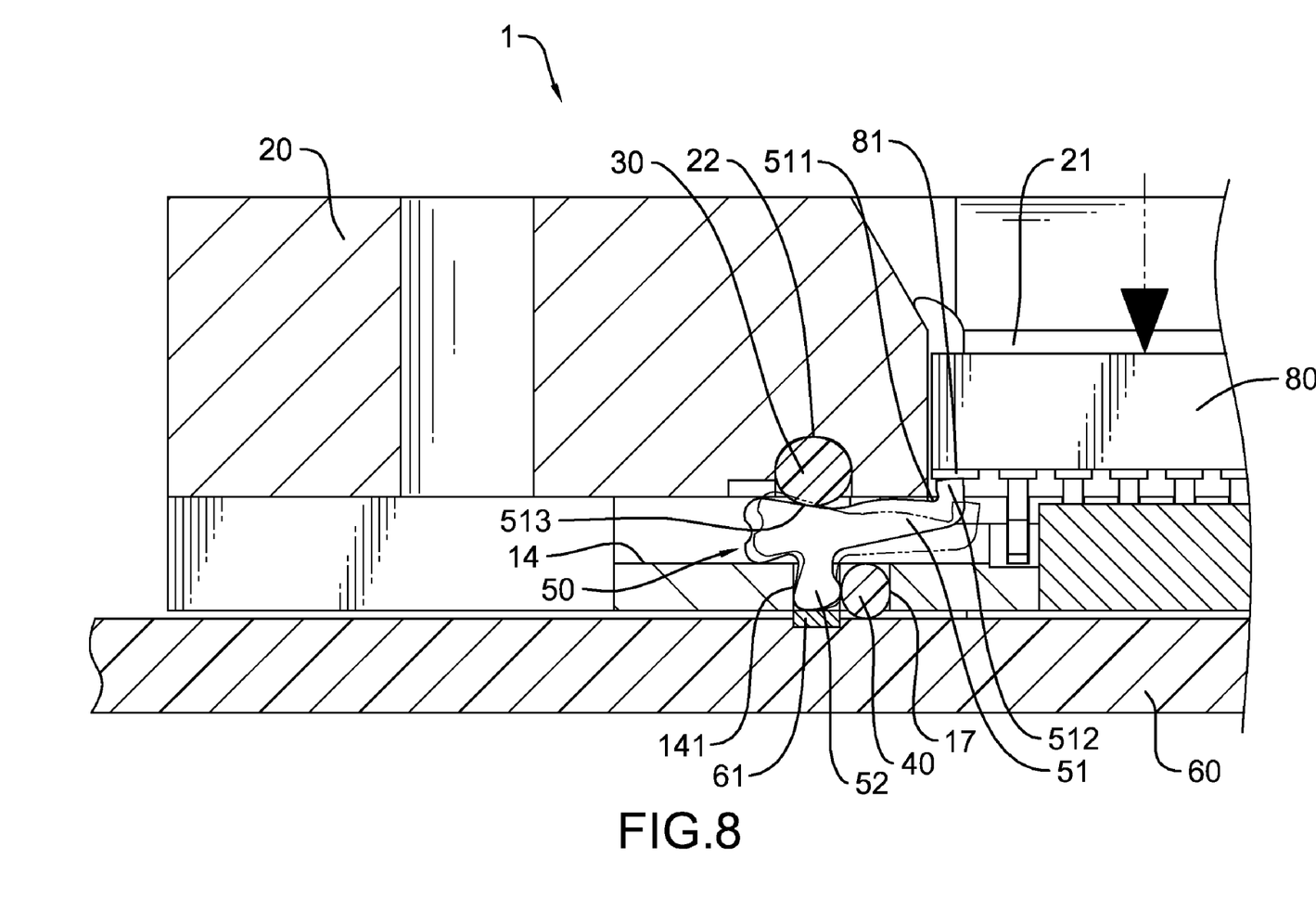
FIG. 8 is an enlarged side view in partial section of a third embodiment of a connection base assembly in accordance with the present invention.

With reference to FIGS. 5 and 6, the top edge of the contacting segment (51) of each conductive element (50) may be corrugated. In the third embodiment shown in FIG. 8, the contacting segment (51) of each conductive element (50) further has a protrusion (512) formed on and protruding from the top edge at the pressing end (511) of the contacting segment (51). The protrusions (512) on the contacting segments (51) of the conductive elements (50) can contact with contacting points/balls (81) formed on an IC (80) to make the connection base assembly (1) can fit with different types of ICs and is versatile in use.

With such a connection base assembly (1) in accordance with the present invention, the resilient elements (30,40) are respectively mounted on and abut with the tops and bottoms of the conductive elements (50). A downward torque applied to the conductive elements (50) can be efficiently absorbed by the resilient elements (30,40) arranged respectively on the tops and bottoms of the conductive elements (50). Accordingly, the conductive elements (50) can be supported and pivotally rotated stably, and a stable electrical connection between the legs/contacting points (71,81) on an IC (70,80), conductive elements (50) and conductive points (61) on the circuit board (60) is achieved.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connection base assembly for an IC testing apparatus comprising:
   a base having a top and a bottom and comprising
      a bottom board having a top; and
      an outer frame formed around and connected to the bottom board and having
         a top;
         a bottom; and
         multiple grooves defined in the top of and extending to the bottom of the outer frame to form multiple through holes in the bottom of the outer frame;
   a top cap mounted securely on the top of the base and having a bottom and a positioning hole defined through the top cap and corresponding to the bottom board of the base; and
   a conductive assembly mounted between the base and the top cap and comprising
      multiple conductive elements mounted respectively in the grooves in the outer frame of the base and each comprising
         a contacting segment having a top edge, a bottom edge, an abutting end, a pressing end protruding from the top of the bottom board of the base and a protrusion formed on and protruding from the top edge at the pressing end of the contacting segment; and
         a connecting segment formed on and protruding from the bottom edge of the contacting segment and extending into the through hole of a corresponding groove;
      multiple top resilient elements mounted on the top of the base and abutting against the abutting ends of the contacting segments of the conductive elements; and
      multiple bottom resilient elements mounted on the bottom of the base and abutting with the connecting segments of the conductive elements.

2. The connection base assembly as claimed in claim 1, wherein the top edge of the contacting segment of each conductive element is corrugated.

3. The connection base assembly as claimed in claim 2, wherein
   the grooves in the outer frame are arranged in multiple groups;
   the outer frame of the base further has multiple top positioning recesses defined in the top of the outer frame and communicating respectively with the groups of the grooves;
   the top cap further has multiple holding recesses defined in the bottom of the top cap and aligning respectively with the top positioning recesses in the outer frame; and
   the top resilient elements are held respectively in the aligning holding recesses in the top cap and the top positioning recesses in the outer frame.

4. The connection base assembly as claimed in claim 3, wherein the outer frame further has multiple bottom positioning recesses defined in the bottom of the outer frame, and each bottom positioning recess communicating with the through holes of a corresponding group of the grooves and holding one of the bottom resilient elements inside.

5. The connection base assembly as claimed in claim 1, wherein
   the grooves in the outer frame are arranged in multiple groups;
   the outer frame of the base further has multiple top positioning recesses defined in the top of the outer frame and communicating respectively with the groups of the grooves;
   the top cap further has multiple holding recesses defined in the bottom of the top cap and aligning respectively with the top positioning recesses in the outer frame; and
   the top resilient elements are held respectively in the aligning holding recesses in the top cap and the top positioning recesses in the outer frame.

6. The connection base assembly as claimed in claim 5, wherein the outer frame further has multiple bottom positioning recesses defined in the bottom of the outer frame, and each bottom positioning recess communicating with the through holes of a corresponding group of the grooves and holding one of the bottom resilient elements inside.

7. The connection base assembly as claimed in claim 1, wherein the outer frame further has multiple bottom positioning recesses defined in the bottom of the outer frame, and each bottom positioning recess communicating with the through holes of a corresponding group of the grooves and holding one of the bottom resilient elements inside.

* * * * *